United States Patent [19]

Sevastopoulos

[11] Patent Number: 5,426,393
[45] Date of Patent: Jun. 20, 1995

[54] TUNABLE FILTER NETWORK HAVING DC ACCURACY

[75] Inventor: Nello Sevastopoulos, San Jose, Calif.

[73] Assignee: Linear Technology Corporation, Milpitas, Calif.

[21] Appl. No.: 73,684

[22] Filed: Jun. 9, 1993

[51] Int. Cl.[6] .................... H03K 5/22; H03K 5/153
[52] U.S. Cl. ............................ 327/552; 327/67; 327/73; 327/311
[58] Field of Search ............................ 307/520–521, 307/355, 358, 543; 328/167

[56] References Cited

U.S. PATENT DOCUMENTS 5,331,222 7/1994 Lin et al. .......................... 328/167

OTHER PUBLICATIONS

Linear Technology Corporation; Initial Release "LT1211/1212 (14MHz, 7V/μ, Single Supply Dual and Quad Precision Op Amps)"; Jan. 1993; pp. 1–8.

*Primary Examiner*—Margaret Rose Wambach
*Attorney, Agent, or Firm*—Flehr, Hohbach, Test, Albritton & Herbert; Kevin J. Zimmer

[57] ABSTRACT

A highly DC accurate filter network capable of implementing a transfer function of arbitrary complexity is disclosed herein. The filter network includes a differential integration and summation network having a first input port connected to an input terminal of the filter network, a second input port, and an output port. A filter circuit having a predefined transfer function is connected between the output port and an output terminal of the filter network. In addition, a feedback path connects the output terminal to the second input port of the differential integration and summation network. During operation of the filter network the filter circuit cooperates with the differential integration and summation network so as not to affect the amplitude of the DC component of an input signal applied to the input terminal. This results in high DC accuracy even if the filter circuit is implemented using, for example, active components. Moreover, the overall transfer characteristic of the filter remains highly DC accurate even when filter circuits having adjustable transfer characteristics, such as clock-tunable switched capacitor filters, are incorporated therein.

15 Claims, 5 Drawing Sheets

TUNABLE FILTER NETWORK HAVING DC ACCURACY

FIELD OF THE INVENTION

This invention relates generally to electrical filter circuits, and more particularly to a filter architecture having a tunable AC response characteristic and improved DC accuracy.

BACKGROUND OF THE INVENTION

Of the various types of electrical filter circuits currently used, one of the simplest is a first or second order RC low pass filter circuit. A first order RC network consists of a single resistor and capacitor connected between an input terminal and an output terminal. A second order RC network consists of two such resistors and two such capacitors between the input and output terminals, as specifically illustrated in FIG. 1. This type of low pass filter circuit is highly DC accurate. That is, this type of circuit, which includes no active elements, does not act upon the DC component except to pass it from the input terminal to the output terminal. This is best illustrated in FIG. 2 by means of the solid line curve which graphically illustrates output voltage on the vertical axis as a function of frequency on the horizontal axis for a pure RC filter circuit of the type illustrated in FIG. 1. The DC accuracy of the pure RC filter circuit may be appreciated by noting that in FIG. 2 the DC component (frequency=0) at the output terminal is equal to the DC component at the input terminal.

Although highly DC accurate, it can be seen by reference to FIG. 2 that pure RC filter circuits produce an output voltage which begins to taper off immediately for frequencies above DC, and continues to do so until reaching the cut off frequency $F_c$. By definition $F_c$ is the frequency at which the input voltage is attenuated by 3 decibels or $V_{out}=V_{in}\sqrt{2}$. Ideally, a low pass filter maintains the output voltage equal to the input voltage, i.e., unity gain, throughout a low frequency band between zero frequency and a particular selected cut off frequency, whereupon the input voltage (at and above the cut off frequency) drops to zero. Ideal bandpass filters exhibit a similar instantaneous change between bands of zero and unity gain.

In an attempt to sharpen the roll-off characteristics of filter circuits there have been proposals which combine a pure RC circuit network with circuitry including active components (e.g., operational amplifiers). The active circuit cooperates with the RC network to improve filter performance by reducing pass band roll-off. Unfortunately, such active filters are generally not DC accurate. That is, the output at zero frequency may be equal to the DC component of the input or it may be greater or less than the DC component. This DC offset error typically arises as a consequence of the action of an operational amplifier in attempting to compensate for the presence of the DC component in the input signal.

As is well known, certain implementations of active filter circuits include switched capacitor networks comprised of capacitors, analog switches, and operational amplifiers. As compared with conventional active-RC filters, switched capacitor filters afford the advantage of having filter transfer characteristics determined on the basis of an adjustable clock frequency and capacitor ratios, rather than in accordance with RC products. Since capacitor ratios can be very precisely controlled using existing semiconductor processing techniques, and are stable with temperature, it is possible to achieve very accurate filter transfer functions.

However, in designing active filters incorporating switched capacitor networks it has generally been required to consider the effect of the impedance presented by the resistive and capacitive (RC) elements external to such networks upon the filter response characteristic. Since the filter response characteristic tends to depend upon the clock frequency of the switched capacitor network, when the external or internal clock frequency changes the filter response changes shape. This shape perturbation degrades performance, and in extreme cases may even cause the filter to cease functioning in the desired manner. Therefore, to tune the filter in accordance with the desired response characteristic, external RC elements need to be separately chosen at each clock frequency.

OBJECTS OF THE INVENTION

In view of the foregoing, it is an object of the present invention to provide a filter architecture allowing the realization of filter circuits having improved DC accuracy and relatively rapid roll-off characteristics.

Another object of the present invention is to provide a filter circuit capable of utilizing active components in such a way that the DC offset of the input signal applied to the filter is equivalent to the DC offset of the filter output signal.

A further object of the present invention is to provide a switched capacitor filter capable of being clock-tuned without adjustment of external RC elements at each clock frequency.

SUMMARY OF THE INVENTION

As will be seen hereinafter, the present invention comprises a highly DC accurate filter network capable of implementing a transfer function of arbitrary complexity. The filter network includes a differential integration and summation network having a first input port connected to an input terminal of the filter network, a second input port, and an output port. A filter circuit having a predefined transfer function is connected between the output port and an output terminal of the filter network. In addition, a feedback path connects the output terminal to the second input port of the differential integration and summation network. During operation of the filter network the filter circuit cooperates with the differential integration and summation network so as not to affect the amplitude of the DC component of an input signal applied to the input terminal. In accordance with a feature of the invention high DC accuracy is maintained even for filter circuits realized using active components. Moreover, the overall transfer characteristic of the filter remains highly DC accurate even when filter circuits having adjustable transfer characteristics, such as clock-tunable switched capacitor filters, are incorporated therein.

The objects and features of the invention will be more readily understood from the following detailed description and dependent claims when taken with the drawings.

DETAILED DESCRIPTION OF ILLUSTRATIVE EMBODIMENTS

Figure 1:
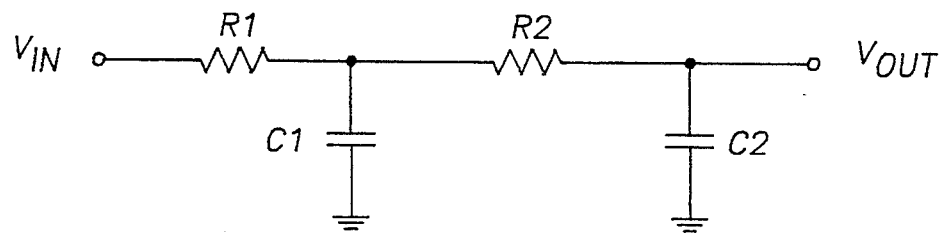
FIG. 1 illustrates a conventional second order RC filter network consisting of two resistors and two capacitors arranged between input and output terminals.
Figure 2:
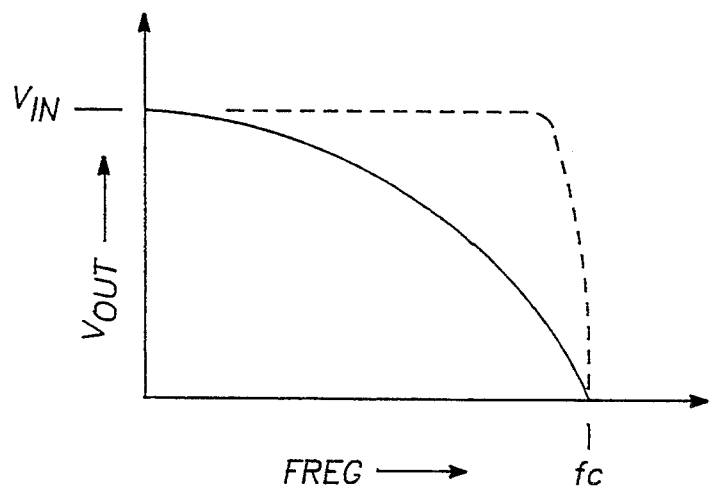
FIG. 2 graphically illustrates output voltage as a function of frequency for a conventional RC filter circuit of the type illustrated in FIG. 1.
Figure 3:
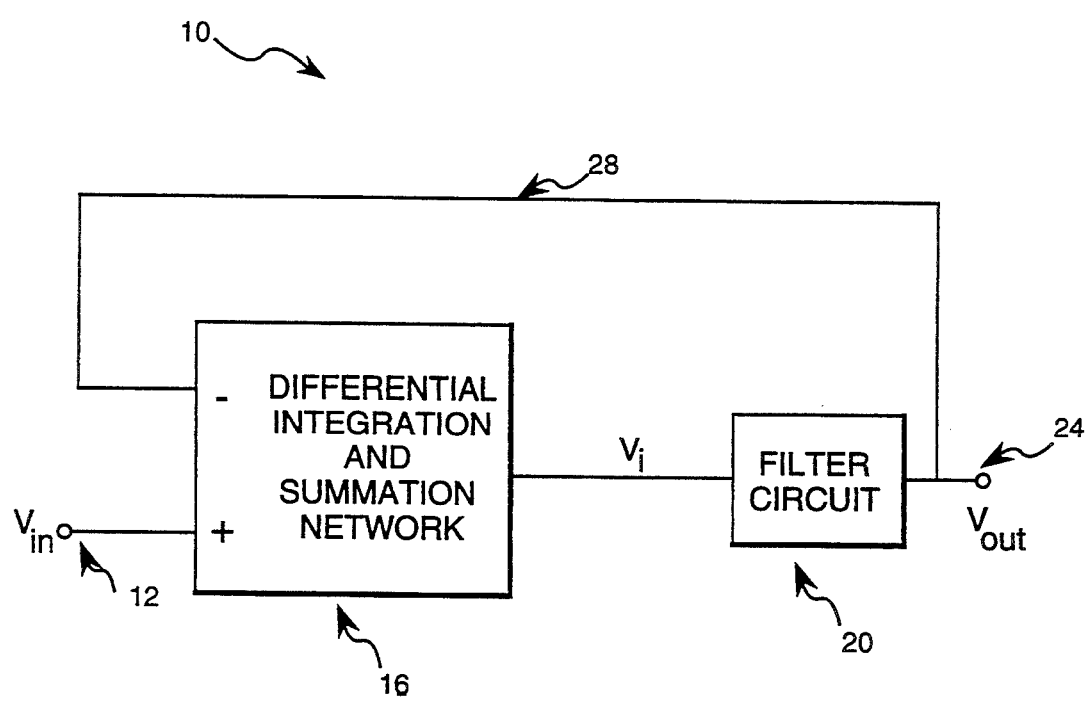
FIG. 3 provides a block diagram representation of a DC-accurate filter network designed in accordance with the present invention.

Referring now to the drawings, attention is directed to FIG. 3 since FIGS. 1-2 have been discussed previously. As indicated above, FIG. 3 provides a block diagram representation of a DC-accurate filter network 10 designed in accordance with the present invention. The filter network 10 includes an input terminal 12 for receiving an electric signal $V_{in}$ containing a DC component as well as higher frequency AC components. The input terminal 12 is connected to a non-inverting input port (+) of a differential integration and summation network 16. Although the operation of the network 16 will be characterized mathematically below, by way of introduction it is noted that the network 16 will include at least one active element, such as an operational amplifier, utilized within a DC feedback loop. The output of the network 16 will hereinafter be referred to as the intermediate voltage $V_i$, which is supplied to a filter circuit 20. The filter circuit 20 may be realized using either active or passive circuit components, but in a preferred embodiment will be implemented as a filter having an adjustable transfer characteristic (e.g., as a clock-tunable switched capacitor filter). The output $V_{out}$ of filter network 10 is taken at output terminal 24, with the terminal 24 being joined to an inverting input terminal (−) of the differential integration and summation network 16 by a feedback path 28.

As may be seen by reference to FIG. 3, the filter circuit 20 closes a DC feedback loop comprised of the network 16 and feedback path 28. Accordingly, the filter circuit 20 should be implemented so as to allow the DC component of the intermediate voltage $V_i$ to be carried by the feedback path 28. Under this condition the DC feedback loop cooperates with the filter circuit 20 to force the DC component of the output voltage to be virtually identical to the DC component of the input signal $V_{in}$. As is explained below, it is a feature of the present invention that the DC feedback loop functions in this manner substantially irrespective of the response characteristics of the filter circuit 20.

In the embodiment of the filter network 10 shown in FIG. 3, the integration and summation network 16 is designed to provide an output of:

$$V_i = k\int(V_{in} - V_-) + V_{in} \tag{1}$$

where $V_- = V_{out}$, and where K is a gain constant of the network 16.

Figure 4:
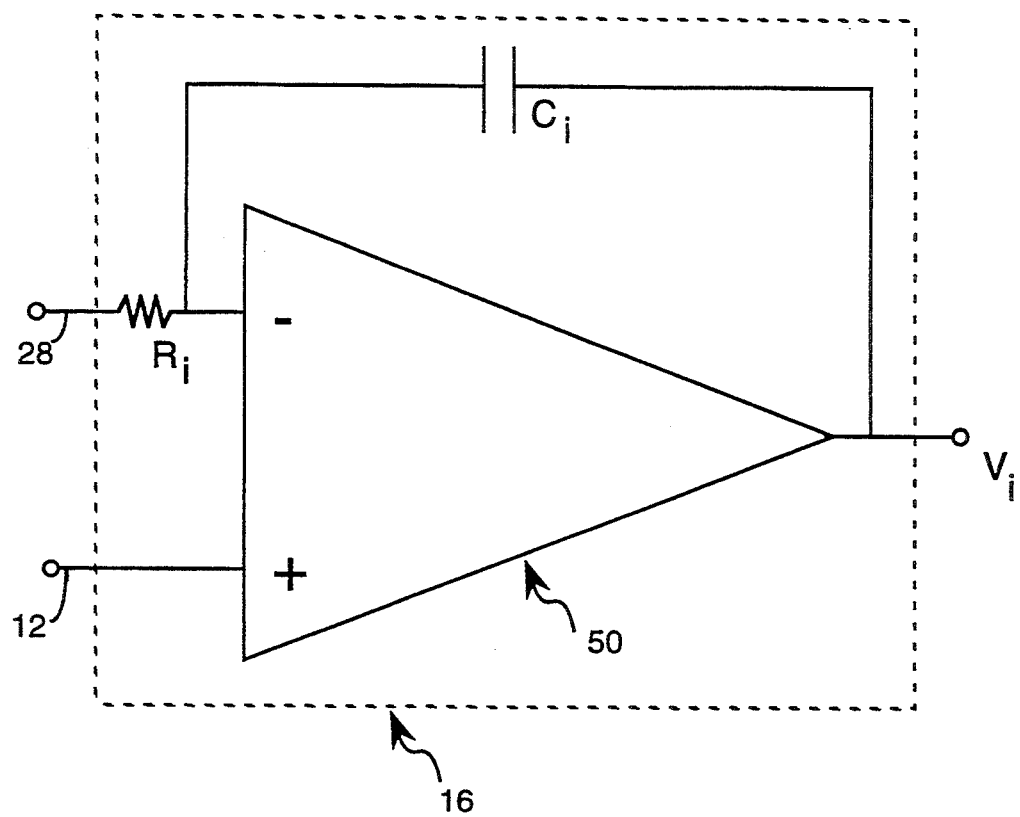
FIG. 4 shows a first implementation of a differential integration and summation network included within the DC-accurate filter network of the present invention.

Referring to FIG. 4, there is shown a particular implementation Of the differential integration and summation network 16 capable of providing an output as defined by equation (1). As is indicated in FIG. 4, the network 16 may include an operational amplifier 50 having a non-inverting input port connected to the input terminal 12. The non-inverting input port of the operational amplifier 50 is connected to the feedback path 28 via resistor $R_1$, and is coupled to the output of operational amplifier 50 through capacitor Ca. The intermediate output voltage $V_i$ produced by the integration and summation network of FIG. 4 may be expressed in terms of the frequency domain variable s, i.e., $s = jw$, as:

$$V_i(s) = V_{in} + \left(\frac{V_{in} - V_{out}}{sR_iC_i}\right) \tag{2}$$

where, again, $V_{out}$ corresponds to the voltage at filter output terminal 24. If the transfer function of the filter circuit 20 is denoted as G, then the overall transfer function $G_T(s)$ of an embodiment of a filter network 10 which incorporates the differential integration and summation network 16 shown in FIG. 4 is:

$$G_T(s) = \frac{V_{out}}{V_{in}} = \frac{G(1 + s\tau)}{G + s\tau} \tag{3}$$

where $\tau = R_iC_i$. As may be deduced from equation (3), the DC value, i.e., $s = 0$, of the transfer function $G_T(s)$ is unity. That is, the open loop gain of the operational amplifier 50 forces the DC component of the output voltage $V_{out}$ to assume the value of the DC component of the input voltage $V_{in}$ irrespective of the frequency selective characteristics of the transfer function G(s) of filter circuit 20. In other words, the filter 10 enables high DC accuracy to be achieved by operating to force the DC values of the input $V_{in}$ and output voltages $V_{out}$ to be substantially identical. Such is the case provided that the input offset voltage and DC bias current of operational amplifier 50 are as low as, for example, those required by the LT1112 Dual Precision Op Amp produced by the Linear Technology Corporation of Milpitas, Calif.

In addition to enhancing DC accuracy, the present invention may be implemented such that, for certain frequencies above DC, the overall transfer function $G_T(s)$ of the filter network 10 becomes substantially identical to the transfer function G of the of the filter circuit 20. That is, the filter network 10 operates to provide essentially absolute DC accuracy while simultaneously assuming the AC transfer characteristics of the filter circuit 20. The conditions under which the filter network 10 behaves in this manner will initially be derived for a filter circuit 20 having a low-pass response $G_1$ of cut-off frequency $f_c$, and will then be generalized to higher-order transfer functions. The cut-off frequency $f_c$ is defined as the frequency at which the filter response falls from a value of unity to a value of $1/\sqrt{2}$. The low-pass response $G_1$ may be expressed in the s-domain as:

$$G(s) = \frac{f_c}{s + f_c} \tag{4}$$

where $s = jf$.

In embodiments where the filter circuit 20 is synthesized as an RC active filter, there exist well-known techniques for modifying the value of the cut-off frequency $f_c$ by adjusting values of the resistive and capacitive filter components. Similarly, in switched capacitor realizations of the filter 20 the frequency $f_c$ varies in accordance with the applied clock frequency. Substituting equation (4) into equation (3) yields:

$$G_T(s) = \frac{(s + f_i) \times f_c}{s(s + f_c) + f_c f_i} \quad (5)$$

where $$f_i = \frac{1}{2\pi R_i C_i}$$

Letting D(s) represent the denominator of $G_T(s)$, one has:

$$D(s) = s(s+f_c)+f_c f_i \quad (6)$$

Referring to equation (6), if $f_i \ll f_c$, then $f_c \approx f_i + f_c$. Under this condition the denominator D(s) becomes:

$$\begin{aligned} D(s) &= s[s + (f_c + f_i)] + f_c f_i \quad (7)\\ &\doteq (s + f_c)(s + f_i) \end{aligned}$$

Substituting equation (7) into equation (5) gives:

$$G_T(s) \approx \frac{f_c(s + f_i)}{(s + f_c)(s + f_i)} \quad (8)$$

Cancelling the common term $(s+f_i)$ from the numerator and denominator results in:

$$G_T(s) \approx \frac{f_c}{s + f_c} \quad (9)$$

or, equivalently:

$$G_T(s)) = G_1(s) \quad (10)$$

That is, under the condition that the $R_i C_i$ time constant of the differential integration and summation network 16 is chosen to be significantly larger than the inverse of the cut-off pulsation $2\pi f_c$ of the filter circuit 20 (i.e., $\frac{1}{2\pi R_i C_i} \ll f_c$, or $R_i C_i \gg \frac{1}{2\pi f_c}$) the overall transfer function $G_T(s)$ of the filter network 10 assumes the characteristics of the filter transfer function G(s).

As is made clear by equation (10), selection of an RC time constant for the differential integration and summation network 16 resulting in a suitably low value of the frequency $f_i$ relative to the lowpass cutoff frequency $f_c$ precludes RC elements within the network 16 from affecting the transfer function of the filter circuit 20. For example, it is believed that the choice of resistive and capacitive elements resulting in a frequency $f_i$ of 0.01 Hz would result in the overall transfer function $G_T(s)$ closely approximating the transfer function of a filter circuit 20 having a lowpass cutoff frequency of 1 Hz. It is thus a feature of the present invention that the integrity of the transfer function of the filter circuit 20 is preserved, and the DC accuracy of the filter network 10 is maintained, irrespective of whether the filter circuit 10 is implemented using active or passive components. This enables, for example, the filter circuit 20 to be realized as a switched capacitor circuit having a clock-tuned low-pass cut-off frequency. As is indicated by equation (10), such a switched capacitor network could be retuned without having to adjust the RC components within the network 16 subsequent to each change in clock frequency.

In what follows there is derived a set of conditions under which equation (10) would hold for a filter circuit 20 having a higher-order, i.e., a multiple pole, low-pass transfer characteristic of the form:

$$G(s) = \frac{N}{D(s)}, \quad (11)$$

where $$D(s) = s^n + a_{n-1}s^{n-1} + a_{n-2}s^{n-2} + \ldots + a_1 s + a_0,$$

and where N is a constant. Using equations (5) and (11) one obtains the following expression for the overall gain $G_T(s)$:

$$G_T(s) = \frac{N(s + f_i)}{sD(s) + Nf_i}, \quad (12)$$

where $$f_i = \frac{1}{2\pi R_i C_i},$$

and where $R_i C_i$ corresponds to the time constant of the differential integration and summation network 16. Again, it is desired to determine the criteria under which the network 10 will have an overall transfer function $G_T(s)$ which mirrors the high-order low-pass transfer characteristic of the filter circuit 20. Referring to equation (12), it may be easily shown that $$NF_i + sD(s) \approx D(s)(s + f_i), \quad (13)$$

if and only if,

Substituting the right side of the approximate equality in equation (13) for the denominator of equation (12) yields:

$$f_i \ll a_{n-1}, \quad (14)$$
$$f_i \ll \frac{a_{n-2}}{a_{n-1}},$$
$$f_i \ll \frac{a_{n-3}}{a_{n-2}}, \text{ and}$$
$$\vdots$$
$$f_i \ll \frac{a_0}{a_1}.$$

$$G_T(s) \approx \frac{N(s + f_i)}{D(s)(s + f_i)} = \frac{N}{D(s)} \quad (15)$$

or, equivalently, $$G_T(s) \approx G(s) \quad (16)$$

It is apparent that equations (15) and (16) would hold even if the numerator N were a function of the frequency variable s, i.e, even if the transfer function G(s) included zeroes as well as poles. Accordingly, equation (16) is valid for a filter circuit 20 of an arbitrary transfer function G(s) provided that:

(i) a set of conditions analogous to those set forth in equation (14) can be derived for the filter circuit, and (ii) a DC signal path exists between the feedback path 28 and the integration and summation network 16 (FIG. 1). The latter constraint is satisfied by, for example, filters having lowpass and band-reject frequency response characteristics.

As an example, a set of constraints upon the value of $f_i$ obtained by using equation (15) are set forth below for a filter circuit 20 realized as a conventional five pole, Butterworth lowpass filter having a transfer function:

$$G_B(s) = \frac{1}{s^5 + 3.235s^4 + 5.235s^3 + 5.235s^2 + 3.235s + 1} \quad (17)$$

where $G_B(s)$ has been normalized to a cutoff frequency of 1 Hz. Applying the criteria set forth by equation (14) to 5 the transfer function $G_B(s)$ results in:

$$f_i << 3.235 \quad (18)$$
$$f_i << \frac{5.235}{3.235}$$
$$f_i << \frac{5.235}{5.235} = 1, \text{ and}$$
$$\vdots$$
$$f_i << \frac{1}{3.235}.$$

The value of $f_i$ is chosen to satisfy the most stringent requirement imposed by equation (18); namely, that $f_i$ be much less than 1/3.235. It is observed that if the transfer function of filter circuit 20 is tuned so as to increase the cutoff frequency of the transfer function $G_B(s)$, the constraints upon the value of $f_i$ set forth in equation (18) are correspondingly relaxed. For example, if the cutoff frequency is changed from 1 Hz to, for instance, 10 Hz, the most stringent inequality in equation (18) becomes $f_i << 1/3.235$. Accordingly, the strictures of equation (18) are assured of being satisfied notwithstanding a change in the cutoff frequency of the filter circuit 20 if the value of $f_i$ is selected to meet the requirements associated with the lowest anticipated cutoff frequency.

As an additional example, the permissible values of $f_i$ are derived below for an exemplary elliptical low pass filter having a transfer function which includes numerator zeroes. Specifically, the transfer function of a $2^{nd}$ order elliptical filter may be expressed as:

$$G(s) = \frac{k(s^2 + f_n^2)}{s^2 + sf_o\alpha + f_o^2}; \quad (19)$$

or equivalently, $$G(s) = \frac{N}{D} \quad (20)$$

such that $N = k(s^2 + f_n^2)$ and $D = s^2 + sf_o\alpha + f_o^2$, where $f_o$ and $f_n$ denote center and notch frequencies, respectively, of the elliptical filter. The parameter $\alpha$ corresponds to the inverse of the quality coefficient, Q, i.e., $$\alpha = \frac{1}{Q}; \quad (21)$$

while the quantity k denotes the gain factor of the elliptical filter. The passband gain of an elliptical low pass filter is defined as:

$$G(0)|_{S=0} = \frac{kf_n^2}{f_o^2} = 1 \quad (22)$$

-continued $$\text{passband } k = \frac{f_o^2}{f_n^2} \quad (23)$$

In what follows equation (13) will be employed to determine a set of constraints upon the value of $f_i$ for both an elliptical notch filter and an elliptical lowpass filter. For a notch filter, $f_n^2 = f_o^2$ and hence $k=1$, while for a lowpass filter $f_o < f_n$ and thus $k<1$. From equation (13), $$Nf_i + sD = D(s + f_i).$$

which yields the following approximate equalities after substitution from equation (1):

$$(kf_i + f_o\alpha) \approx f_o\alpha + f_i \quad (i)$$

$$f_o^2 \approx f_o^2 + f_o\alpha f_i \quad (ii)$$

The expression in (ii) requires $$f_i << \frac{f_o}{\alpha} = f_o Q \quad (24)$$

in order that the filter function G(s) be made DC accurate. The expression set forth in (i) implies a gain factor of approximately unity ($k \approx 1$) which, as noted above, describes an elliptical notch filter. In order to satisfy (i) in the case of a lowpass filter, i.e., $f_o < f_n$ and $k<1$, it is necessary that, $$f_i << f_o\alpha = \frac{f_o}{Q} \quad (25)$$

Accordingly, knowledge of the quality coefficient Q specified by equation (21) allows determination of the permissible values of $f_i$ for both lowpass and notch elliptical filters. For cases in which $Q<1$, it is clear that selection of $f_i$ such that $$f_i << \frac{f_o}{Q} \quad (26)$$

results in satisfaction of the criterion for a lowpass filter set forth in equation (24). However, this selection also satisfies equation (23), i.e., $$f_i < f_o Q \quad (27)$$

since for $Q>1$ the right side of (26) is greater than the right side of (25). Similarly, for $Q<1$ the choice of $$f_i << f_o Q \quad (28)$$

satisfies both $$f_i << \frac{f_o}{Q} \quad (29)$$

and $$kf_i << \frac{f_o}{Q}. \quad (30)$$

In embodiments wherein the filter circuit 20 is realized as a clock-tuned switched capacitor filter, the integration and summation network 16 would be designed on the basis of the lowest operating clock frequency of the circuit 20. In particular, the resistive and capacitive elements within the network 16 would be selected such that the value of fi meets the requirements of equation (18) with respect to the lowest clock frequency of the filter circuit 20. In this way a desired filter response characteristic may be maintained as the cutoff frequency of the switched capacitor filter is adjusted by changing the clock frequency.

Figure 5:
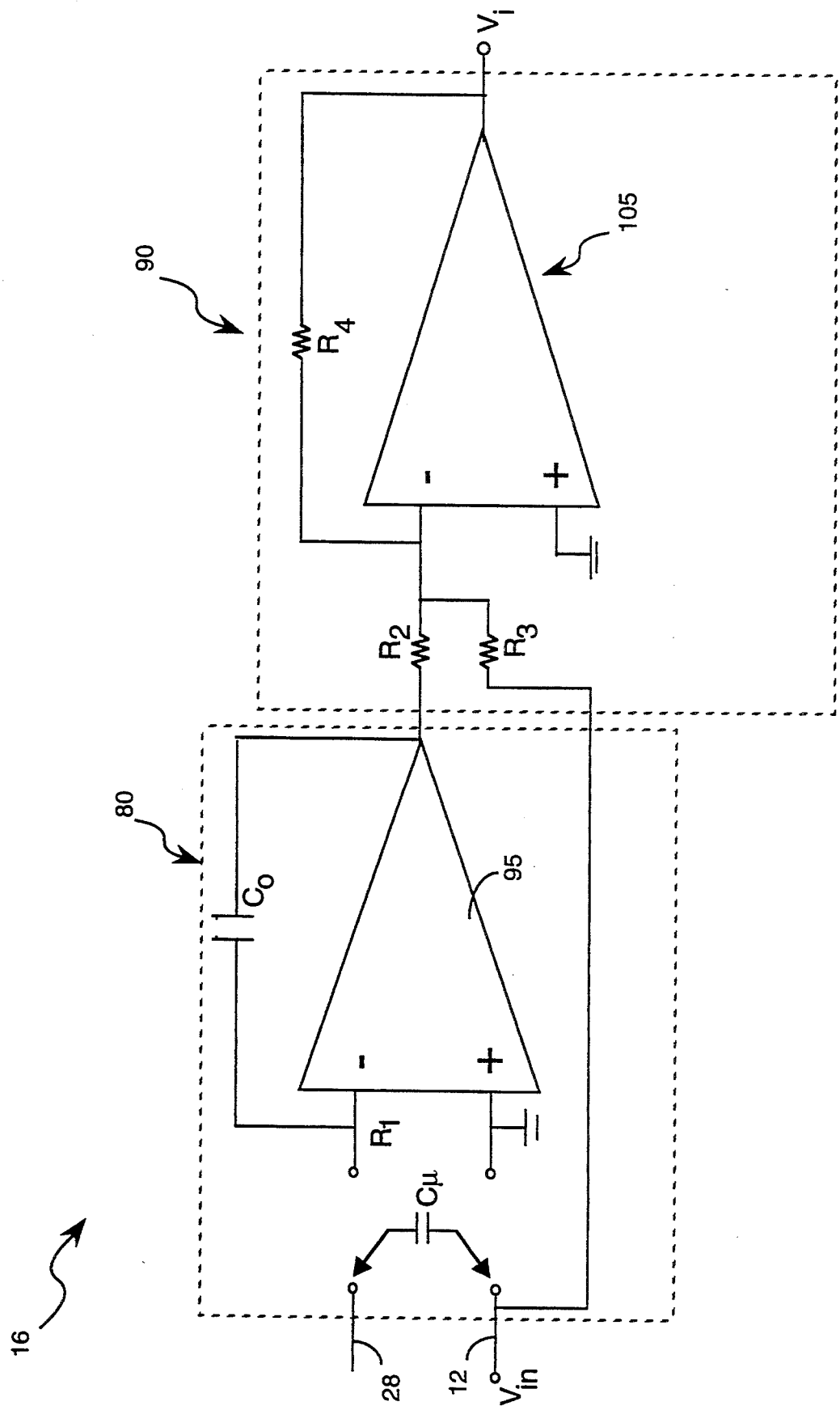
FIG. 5 depicts a switched capacitor implementation of the differential integration and summation network.

In embodiments of the filter network 10 wherein the filter circuit 20 is realized as an integrated circuit using switched capacitors, it may be advantageous to similarly realize the differential integration and summation network 16 using a switched capacitor circuit. In this regard FIG. 5 depicts a switched capacitor implementation of the differential integration and summation network 16. As shown in FIG. 5, this switched capacitor implementation includes a differential integrator 80 coupled to a summer 90. The integrator 30 comprises a switched capacitor element Cu which, in a first switch position, is connected between the feedback path 28 and input terminal 12. During each clock period the capacitor element Cu is switched between the first switch position and a second switch position. In the second switch position the capacitor element Cu is connected between signal ground and the inverting (−) input port of an integrating operational amplifier 95. The integrator 80 further includes a feedback capacitor $C_o$ coupled to the output, and to the inverting input, of the operational amplifier 95.

Referring to FIG. 5, the summer 90 includes a summing operational amplifier 105 having an inverting input (−) connected by resistor $R_2$ to the output of integrating operational amplifier 95. The inverting input of the operational amplifier 105 is also linked to the input terminal 12 through a resistor $R_3$. The summer 90 further includes a feedback resistor $R_4$ for joining the inverting input to the output of operational amplifier 105. In general, resistors $R_2$, $R_3$ and $R_4$ will be of identical magnitude so as to accord equal weight to the signals received by the summer 90 via resistors $R_2$ and $R_3$.

The value of $f_i$ associated with the differential integration and summation network shown in FIG. 5 may be expressed as:

$$f_i = \frac{1}{2\pi R_{eff} C_{eff}}$$
$$= \frac{(C_\mu)(f_{clk})}{2\pi C_o}$$

where $R_{eff}$ and $C_{eff}$ represent the effective resistance and capacitance of the integrator 80, and where $f_{clk}$ denotes the frequency of the clock signal supplied to the switched capacitor element Cu.

Figure 6:
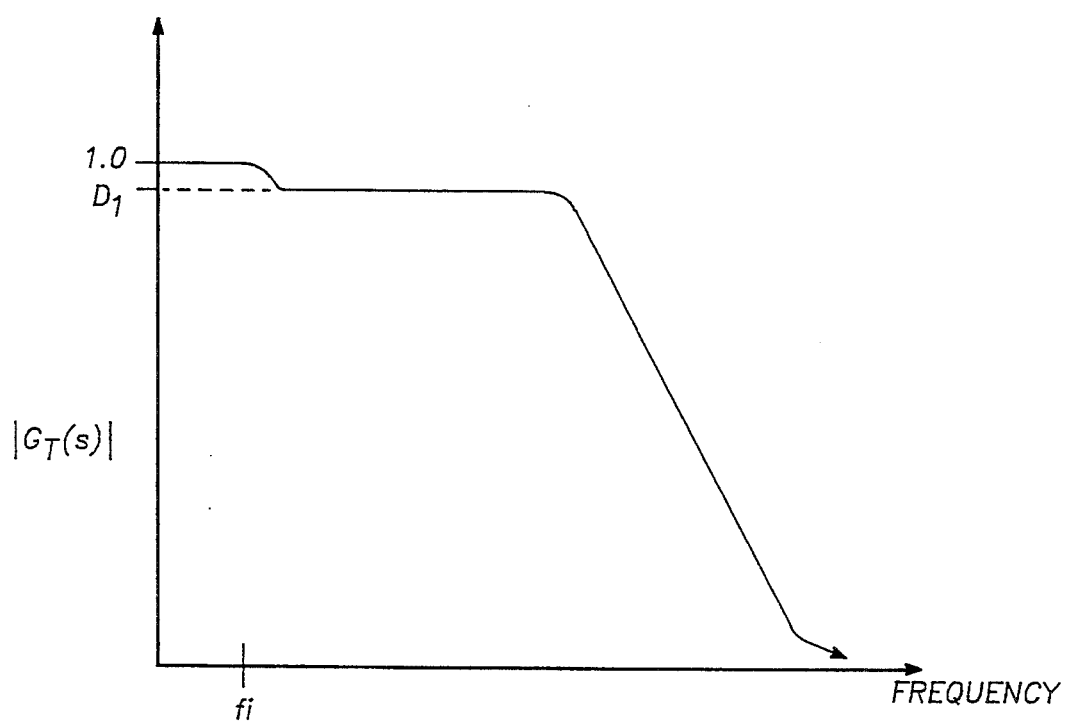
FIG. 6 depicts, as a function of frequency, the transfer function $G_T(s)$ of a filter network in accordance with the invention which includes a filter circuit having a DC gain of $D_1$.

As is evident upon inspection of equation (3), the overall gain response $G_T(s)$ of the filter network 10 is equal to unity for DC input signals, i.e., s=0. As the input frequency is increased, the DC feedback loop including the integration and summation network 16 and feedback path 28 (FIG. 3) continues to maintain consistency between the DC component of the input signal and the DC component of the signal appearing at the output terminal 24. However, at frequencies greater than $f_i$ the overall response $G_T(s)$ filters the AC components of the input signal in accordance with the transfer characteristics of the filter circuit 20. Accordingly, if the DC gain ($G_{DC}$) of the filter circuit 20 is not equal to unity there will exist a transition region in the overall response $G_T(s)$ from unity to the value of $G_{DC}$ at frequencies above the frequency $f_i$. This phenomenon may be more fully appreciated with reference to FIG. 6, which depicts, as a function of frequency, the transfer function $G_T(s)$ of a filter network 10 having a filter circuit with a DC gain of $D_1$. It is observed that the overall response $G_T(s)$ may be shaped by controlling the range of frequencies spanned by this transition region, i.e., by controlling the value of $f_i$. Again, the value of $f_i$ may be adjusted by choosing the equivalent RC time constant of the integration and summation network 16 in the manner described above.

In the embodiments disclosed herein, the transfer function $G(s)$ of the filter circuit 20 may be formed by any suitable circuitry. In particular embodiments such circuitry may comprise a readily provided switched capacitor network in combination with a clock generator. However, once a desired filtering characteristic has been selected, one with ordinary skill in the art can readily design appropriate circuitry to be included within the filter 20.

While the invention has been described with reference to specific embodiments, the description is illustrative of the invention and is not to be construed as limiting the invention. Thus, various modifications and applications may occur to those skilled in the art without departing from the true spirit and scope of the invention as defined by the appended claims.

I claim:

1. A filter network having an input and an output terminal, comprising:
    a differential integration and summation network having a first input port connected to said input terminal, a second input port, and an output port; said differential integration and summation network receiving an input signal at said first input port and a feedback signal at said second input port;
    a filter circuit connecting said output port to said output terminal; and
    a feedback path for providing said feedback signal from said output terminal to said second input port;
    wherein said filter circuit cooperates with said differential integration and summation network so as not to affect amplitude of a DC component of said input signal.

2. The filter network of claim 1 wherein said differential integration and summation network includes an operational amplifier having a non-inverting input connected to said first input port and an inverting input resistively connected to said second input port.

3. The filter network of claim 2 wherein said differential integration and summation network further includes a capacitive element connected between an output terminal of said operational amplifier and said inverting input.

4. The filter network of claim 1 wherein said differential integration and summation network includes a capacitor switchably connected between said first and second input ports, said capacitor also being switchably connected to an inverting input of an integrator circuit.

5. A filter network having an input and an output terminal, comprising:
    a differential integration and summation network having a first input port connected to said input terminal, a second input port, and an output port, said differential integration and summation network including an integrator and a summer, said summer having a first input port connected to an output of said integrator circuit and a second input port connected to said input terminal;

a filter circuit connecting said output port to said output terminal; and a feedback path connecting said output terminal to said second input port wherein said filter circuit cooperates with said differential integration and summation network so as not to affect amplitude of a DC component of an input signal applied to said input terminal.

6. A filter network comprising:

an operational amplifier having first and second inputs and an output;

a signal input terminal, connected to said first input, for receiving an input signal including a DC component;

a resistive element connected between said first input and a filter output terminal;

a capacitive element interconnected between said second input and said output of said operational amplifier; and a filter circuit connected between said output of said operational amplifier and said filter output terminal, said filter circuit cooperating with said operational amplifier and with said resistive and capacitive elements so as not to affect amplitude of said DC component of said input signal.

7. The filter network of claim 6 wherein said filter circuit comprises an active filter having a predetermined transfer function, said resistive and capacitive elements having magnitudes selected in accordance with said predetermined transfer function.

8. The filter network of claim 6 wherein said filter circuit comprises a low-pass active filter having a predetermined cut-off frequency, said resistive and capacitive elements having magnitudes selected in accordance with said predetermined cut-off frequency.

9. The filter network of claim 6 wherein said filter circuit comprises a switched-capacitor filter having a predetermined transfer function, said resistive and capacitive elements having magnitudes selected in accordance with said predetermined transfer function.

10. The filter network of claim 9 further including clock means for adjusting AC characteristics of said switched capacitor filter, said switched capacitor filter cooperating with said operational amplifier and with said resistive and capacitive elements so as to substantially prevent said resistive and capacitive elements from affecting filtering of AC components of said input signal.

11. A filter network comprising:

a DC feedback circuit including, operational amplifier means having first and second inputs and an output, a signal input terminal, connected to said first input, for receiving an input signal including a DC component, resistive means connected between said first input and an output terminal of said filter network, capacitive means interconnected between said second input and said output of said operational amplifier; and filter means, interposed between said output of said operational amplifier and said filter output terminal, for filtering said input signal in accordance with a predefined transfer function wherein said filter means cooperates with said DC feedback circuit so as not to affect amplitude of said DC component of said input signal.

12. The filter network of claim 11 wherein said filter means includes an active filter having a predetermined transfer function;

whereby said active filter cooperates with said operational amplifier and with said DC feedback loop so as to Substantially prevent said resistive and capacitive means from affecting filtering of AC components of said input signal.

13. A filter network having an input and an output terminal, comprising:

a differential integration and summation network having a first input port connected to said input terminal, a second input port, and an output port, said differential integration and summation network receiving an input signal at said first input port and a feedback signal at said second input port;

a filter circuit connecting said output port to said output terminal; and a feedback path connecting said output terminal to said second input port wherein a predetermined time constant of said differential integration and summation network is selected in accordance with a transfer function of said filter circuit in order that amplitude of a DC component of an input signal applied to said input terminal is unaffected by said filter network.

14. A filter network having an input and an output terminal, comprising:

a differential integration and summation network having a first input port connected to said input terminal, a second input port, and an output port, said differential integration and summation network receiving an input signal at said first input port and a feedback signal at said second input port;

a filter circuit connecting said output port to said output terminal, said filter circuit being characterized by a frequency transfer function; and a feedback path connecting said output terminal to said second input port wherein a predetermined time constant of said integration and summation network is selected in order that an overall transfer function of said filter network approximates said transfer function of said filter circuit.

15. The filter network of claim 1 wherein said feedback path comprises an electrical short circuit between said output terminal and said second input port of said differential and integration and summation network.

* * * * *